(12) United States Patent
Lu

(10) Patent No.: US 7,429,893 B2
(45) Date of Patent: Sep. 30, 2008

(54) VARIABLE-GAIN AMPLIFIER AND RELATED METHOD

(75) Inventor: Wu-Hung Lu, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 170 days.

(21) Appl. No.: 11/467,922

(22) Filed: Aug. 29, 2006

(65) Prior Publication Data
US 2007/0096818 A1 May 3, 2007

(30) Foreign Application Priority Data
Oct. 21, 2005 (TW) .............................. 94136853 A

(51) Int. Cl.
*H03G 3/00* (2006.01)
(52) U.S. Cl. ......................................... 330/254; 330/69
(58) Field of Classification Search .................. 330/69, 330/252–261; 327/563
See application file for complete search history.

(56) References Cited

U.S. PATENT DOCUMENTS

| 4,528,516 A * | 7/1985 | Hill, III ....................... 330/254 |
| 5,717,360 A | 2/1998 | Vu |
| 5,896,063 A | 4/1999 | Marsh |
| 6,566,951 B1 * | 5/2003 | Merrigan et al. ............. 330/254 |
| 6,788,144 B2 | 9/2004 | Honda |

FOREIGN PATENT DOCUMENTS

| TW | 582137 | 4/2004 |
| TW | 225729 | 12/2004 |

OTHER PUBLICATIONS

P. Huang, L.Y. Chiou, C.K. Wang, "A 3. 3-V CMOS Wideband Exponential Control Variable-Gain-Amplifier", May 1998, pp. I-285~288, IEEE International Symposium on Circuits and Systems.

* cited by examiner

*Primary Examiner*—Robert J. Pascal
*Assistant Examiner*—Khiem D Nguyen
(74) *Attorney, Agent, or Firm*—Winston Hsu

(57) ABSTRACT

A variable gain amplifier, VGA, and related method are provided. A reference current variably controlled by a control signal is provided, then the reference current is divided to a load current and an input-control current according to differential driving between a constant reference signal and the control signal. Then the input-control current and the load current are used to respectively bias an input stage and an active load of the VGA, such that a gain of the VGA is controlled by a ratio between the input-control current and the load current. In this way, the gain can be controlled by the control signal. The VGA can provide wider gain range and better variable gain characteristics because a sum and a difference of the input-control current and the load current are both controlled by the control signal.

9 Claims, 5 Drawing Sheets

VARIABLE-GAIN AMPLIFIER AND RELATED METHOD

BACKGROUND OF THE INVENTION

1. Field of the Invention

The invention relates to a variable-gain amplifier and related method thereof, and more particularly, to a variable-gain amplifier capable of increasing the bias voltage difference during the input stage and active load of a bias amplifier and related method thereof.

2. Description of the Prior Art

Today, as the popularity of transferring, processing, and exchanging various documents, data, and image information through electronic signals increases, the importance of utilizing various types of signal processing circuits to process electronic signals also increases significantly.

Adequately maintaining the magnitude of the signals in electronic signal systems commonly utilized in communication, media, and medical imaging has become critically important, which has ultimately brought out the development of a variable-gain amplifier. A variable-gain amplifier is an amplifier in nature, in which the amplifier is able to gain input signals and output them thereafter, in which the gaining value can be controlled by another control signal, such as a control voltage. Preferably, the variable-gain amplifier can be utilized to adequately adjust the amplitude of signals, such as forming an automatic-gain control (AGC) circuit to automatically adjust the amplitude of the signals.

Since the gain of the variable-gain amplifier can be controlled by the control signal, the variation of the gain corresponding to the change of the control signal is essentially the gain variability of the variable-gain amplifier. Preferably, a variable-gain amplifier is fabricated to achieve a broader gain range, to have better controllability, such as having a high degree of linearity, and to have adequate resistance against the influence of temperatures during fabrication processes. In general, the gain range of a variable-gain amplifier refers to the range of the variable-gain, or the range between the smallest gain and the largest gain of a variable-gain, and the gain range increases as the range of the variable-gain increases within a fixed variation range of the control signal. Hence, a variable-gain amplifier having a broader gain range is able to significantly increase its gain and accommodate a much larger group of different signals and therefore exhibit a much greater value. The control of the variable-gain on the other hand, can be represented by a characteristic curve, in which the characteristic curve relates to the variation between the gain and a control signal. If the characteristic curve matches a particular curve, such as a straight line close to linearity, it indicates that the variation of the gain can be controlled adequately and a much better gain-variation can be produced. Similar to other electronic circuits, factors such as fabrication process variation and temperature shift in circuit operation may cause the property of each circuit device of variable-gain amplifiers to drift from its original value, and ultimately degrade the actual performance of the variable-gain amplifiers. Hence, a well designed variable-gain amplifier should be able to resist those influential factors caused by the fabrication process and maintain its gain variation under harsh conditions.

However, the conventional variable-gain amplifiers are unable to effectively provide a solution to the situations described above. For instance, despite the fact that some of the conventional variable-gain amplifiers may possess satisfactory controllability and resistance to harsh fabrication environment and temperature variation, the variable-gain amplifiers may only include a small gain range, such that a cascade of a plurality of variable-gain amplifiers must be established to achieve a broader gain range. Unfortunately, the cascade of a plurality of variable-gain amplifiers often requires a large layout area, drains a significantly amount of power, and ultimately compresses the bandwidth of the amplifying signal. Additionally, despite some of the conventional variable-gain amplifiers exhibiting a large gain range, they may have weaker resistance against factors during the fabrication process, such as temperatures fluctuations that ultimately cause the property of the variable-gain to drift from its original value.

SUMMARY OF THE INVENTION

It is therefore an objective of the present invention to provide a variable-gain amplifier and related method to achieve a broader gain range.

The variable gain amplifier of the present invention includes a gain controlling circuit and a gain cell, and gains an input signal to an output signal, in which the gain is controlled by a control signal. The gain controlling circuit includes a variable current circuit and a differential current circuit. The variable current circuit provides a corresponding reference current according to the control signal, in which the value of the reference current corresponds to the value of the control signal. The differential current circuit divides the reference current according to the control signal to a load current and an input-control current, in which the difference between the load current and the input-control current is controlled by the value of the control signal. Since the load current and the input-control current are generated from the reference current, the sum of the load current and the input-control current is essentially the reference current.

The gain cell includes a load circuit and an input circuit, as well as other auxiliary circuits, in which the load circuit is utilized to provide an active load. The load circuit is biased according to a load current, such that an equivalent load of the active load is controlled by the magnitude of the load current. The input circuit is utilized for receiving the input signals of the variable gain amplifier and for providing an electrical conversion, such as a transductance to convert the input signals to corresponding electricity, such as converting the input signals that are in a voltage form to currents. After the electricity is input into the load circuit, an input signal is established and utilized as an output of the variable gain amplifier. Similar to the bias voltage relationship between the load current and the load circuit, the input circuit can be biased according to the input-control current, such that the conversion level of the input circuit, such as the value of transductance, can be controlled by the magnitude of the input-control current.

According to the disposition of the gain cell described above, the gain of the variable-gain amplifier of the present invention is determined by the level of electrical conversion of the input circuit and the active load provided by the load circuit. If MOS transistors are utilized to achieve the input circuit and the load circuit, the electrical conversion of the input circuit, such as the transductance value, will be determined by the value of the input-control current, and the resistance-type equivalent load value provided by the load current will be related to the reciprocal of the load current value. Hence, the gain between the input signal and the output signal is controlled by the ratio of the input-control current to the load current. The gain will change accordingly if the ratio of the input-control current to the load current changes. Since the magnitude of both the load current and the input-control current is controlled by the control signal within the gain controlling circuit, the control signal is able to adjust the gain by changing the value of the load current and the input-control current, thereby achieving a variable-gain.

As described above, if the variation between the input-control current and the load current increases within a control signal variation range, such as when the value of the control signal remains in a variation range, the variation of the gain will increase accordingly and achieving a broader gain range. Preferably, the gain controlling circuit of the variable-gain amplifier of the present invention is able to utilize the control signal to control the difference between the input-control current and the load current within the differential current circuit, and utilize the variable current circuit to control the sum of the two currents via the control signal, thereby expanding the variation between the input-control current and the load current and providing a broader gain range for the variable-gain amplifier. According to an embodiment of the present invention, a complementary pair of p-type MOS transistors and n-type MOS transistors can be utilized to achieve the function of a variable current circuit, in which the control signals are conducted on the two transistors respectively and add up to a reference current.

According to another embodiment of the present invention, two MOS transistors of the same type, such as two p-type MOS transistors, can be utilized to drive the input-control current and the load current within the reference current circuit of the gain controlling circuit. Since the currents driven by differential driving are able to provide a stronger resistance against factors such as temperature and fabrication variation, the variable gain of the variable-gain amplifier of the present invention can also provide such characteristic accordingly. Additionally, utilization of the differential driving to perform a division within the differential current circuit provides a more linear and better control for the variable-gain amplifier.

Preferably, the present invention is applied to variable-gain amplifiers or differential input and output variable-gain amplifiers utilized for single end input and output. To achieve a variable-gain amplifier of differential input and output, the variable-gain amplifier of the present invention is able to work in conjunction with a common mode feed back circuit to adjust the common mode level of the differential output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
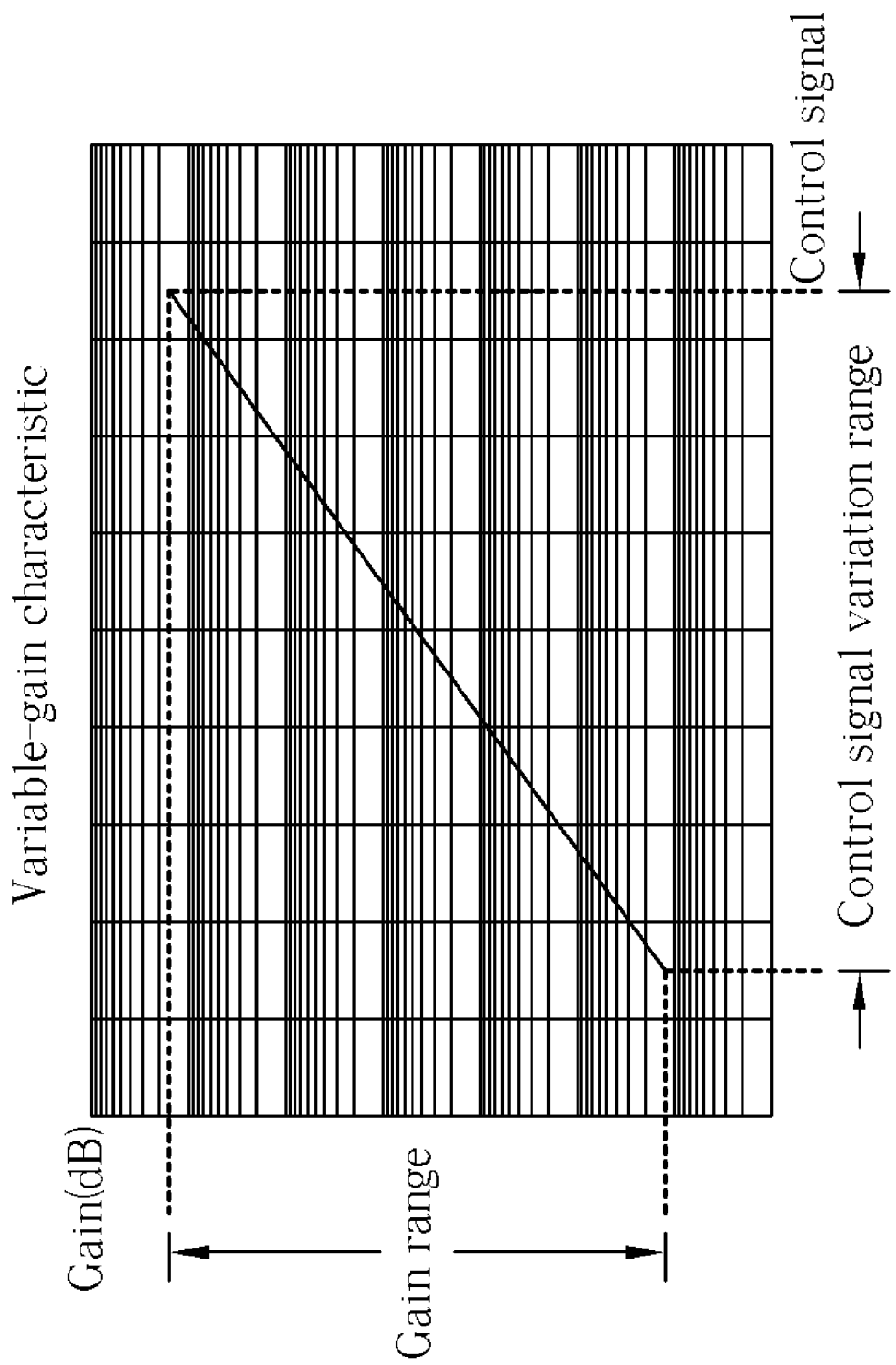
FIG. 1 shows an ideal variable gain of a variable gain amplifier.

Please refer to FIG. 1. FIG. 1 shows an ideal variable gain of a variable gain amplifier, in which the horizontal axis indicates the value of the control signal and the vertical axis indicates the gain of the output signal to the input signal, which is represented by decibel (db). As shown in FIG. 1, the gain range is represented by the range of the gain variables in the control signal variable range. If the gain of a fixed control signal variable range is substantially changed, a much wider gain range can be achieved. Additionally, the ideal variable gain is controlled in a linear fashion between the controlled signals and the gain. In other words, a slanted straight line characterizes the relationship between the control signal and the decibel value of the gain. Hence, if the slope of the linear controllability is increased, a larger and broader gain range can be obtained within a fixed control signal variation range.

Figure 2:
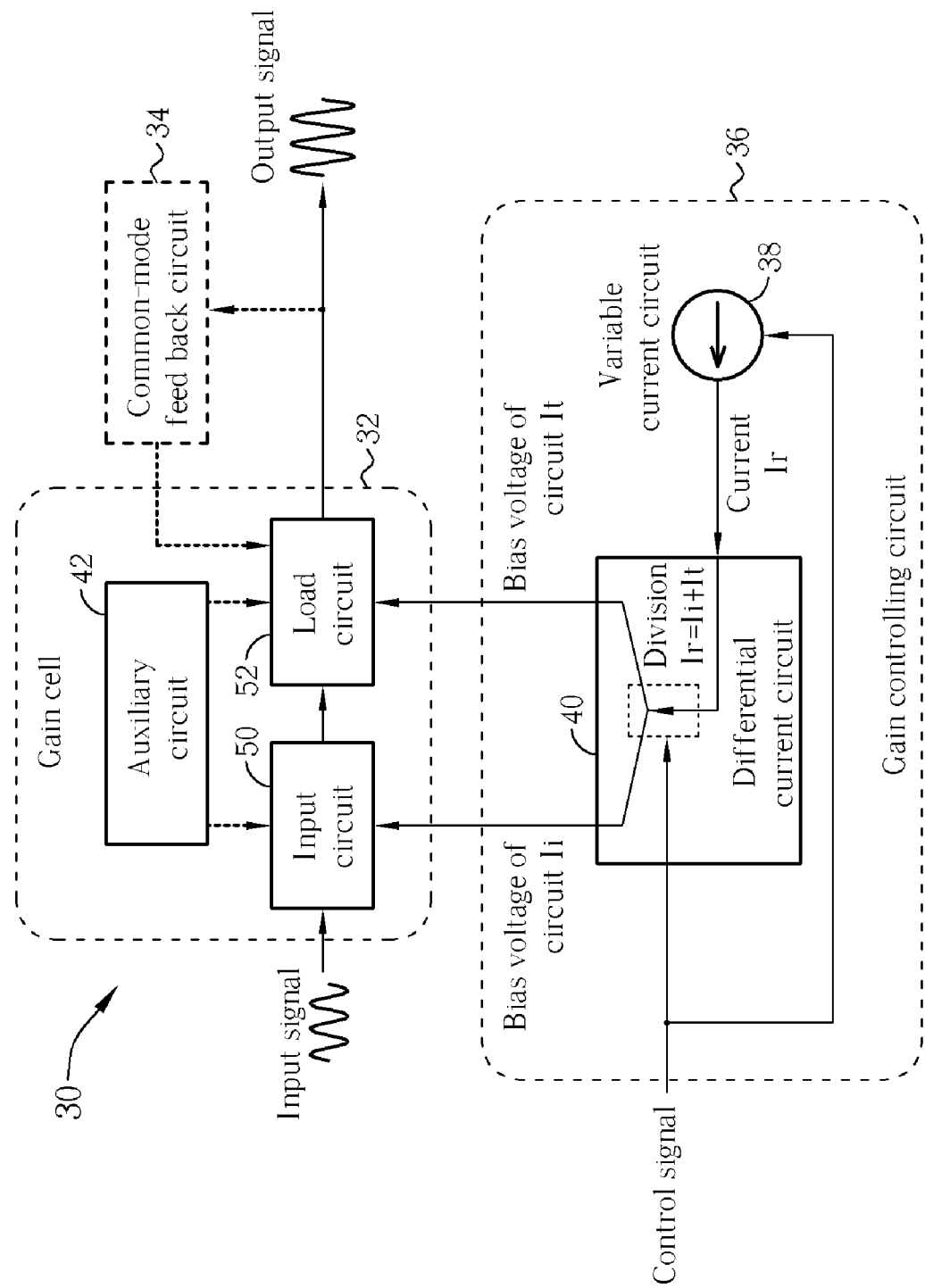
FIG. 2 is a block diagram showing the functionality of an amplifier according to the present invention.

The present invention provides a variable-gain amplifier with an enhanced architecture and performance. Please refer to FIG. 2. FIG. 2 shows the functionality of an amplifier 30 according to the present invention. Preferably, the amplifier 30 is a variable-gain amplifier, in which the variable-gain amplifier is able to gain the input signals to output signals, and the gain between the input signals and the output signals can be adjusted utilizing the magnitude of control signals. To achieve a variable-gain, the amplifier 30 includes a gain cell 32 and a gain controlling circuit 36. Additionally, the gain controlling circuit 36 includes a variable current circuit 38 and a differential current circuit 40, and the gain cell 32 includes an input circuit 50, and a load circuit 52. An auxiliary circuit 42 can be added if needed. The amplifier 30 may also include other auxiliary circuits, such as a common-mode feed back circuit 34 to adjust the common-mode level of the differential output signals.

In the gain controlling circuit 36, the variable current circuit 38 is able to provide a corresponding reference current Ir according to the control signal, in which the value of the reference current Ir is controlled by the value of the control signal. The differential current circuit 40 is able to divide the reference current Ir according to the control signal to a load current It and an input-control current Ii, in which the current difference between the load current It and the input-control current Ii is controlled by the value of the control signal. The sum of the current Ii and the current It will equal to the reference current Ir because the load current It and the input-control current Ii are divided from the reference current Ir.

In the gain cell 32, the load circuit 52 is biased according to the load current It to provide an active load, in which the equivalent loading of the active load can be controlled by the value of the load current It. The input circuit 50 is utilized to receive input signals of the variable-gain amplifier and provide an electrical conversion, such as transductance to convert the input signals to corresponding electricity, such as converting the voltage of input signals to currents. After the electricity is input to the load circuit 52, output signals can be established on the load circuit 52 and be utilized as an output of the variable-gain amplifier 30. Preferably, the input circuit 50 can be biased according to the input-control current Ii, such that the level of electrical conversion (such as the value of transductance) of the input circuit 50 can be controlled by the value of the input-control current Ii.

Preferably, the gain of the amplifier 30 is determined by the degree of electrical conversion of the input circuit 50 and the active load provided by the load circuit 52, in which these two factors are controlled by the input-control current Ii and the load current It. Hence, by changing the input-control current Ii and the load current It, a variable-gain can be achieved. According to the gain controlling circuit 36, the present invention is able to utilize control signals to control the difference between the input-control current Ii and the load current It of the differential current circuit 40, and utilize the variable current circuit 38 to control the sum (hence the reference current Ir) of the two currents via the control signals. Ultimately, the present invention is able to achieve a variable-gain, and at the same time increase the variability between the input-control current the load current, thereby producing a much larger gain range for the variable-gain amplifier.

Figure 3:
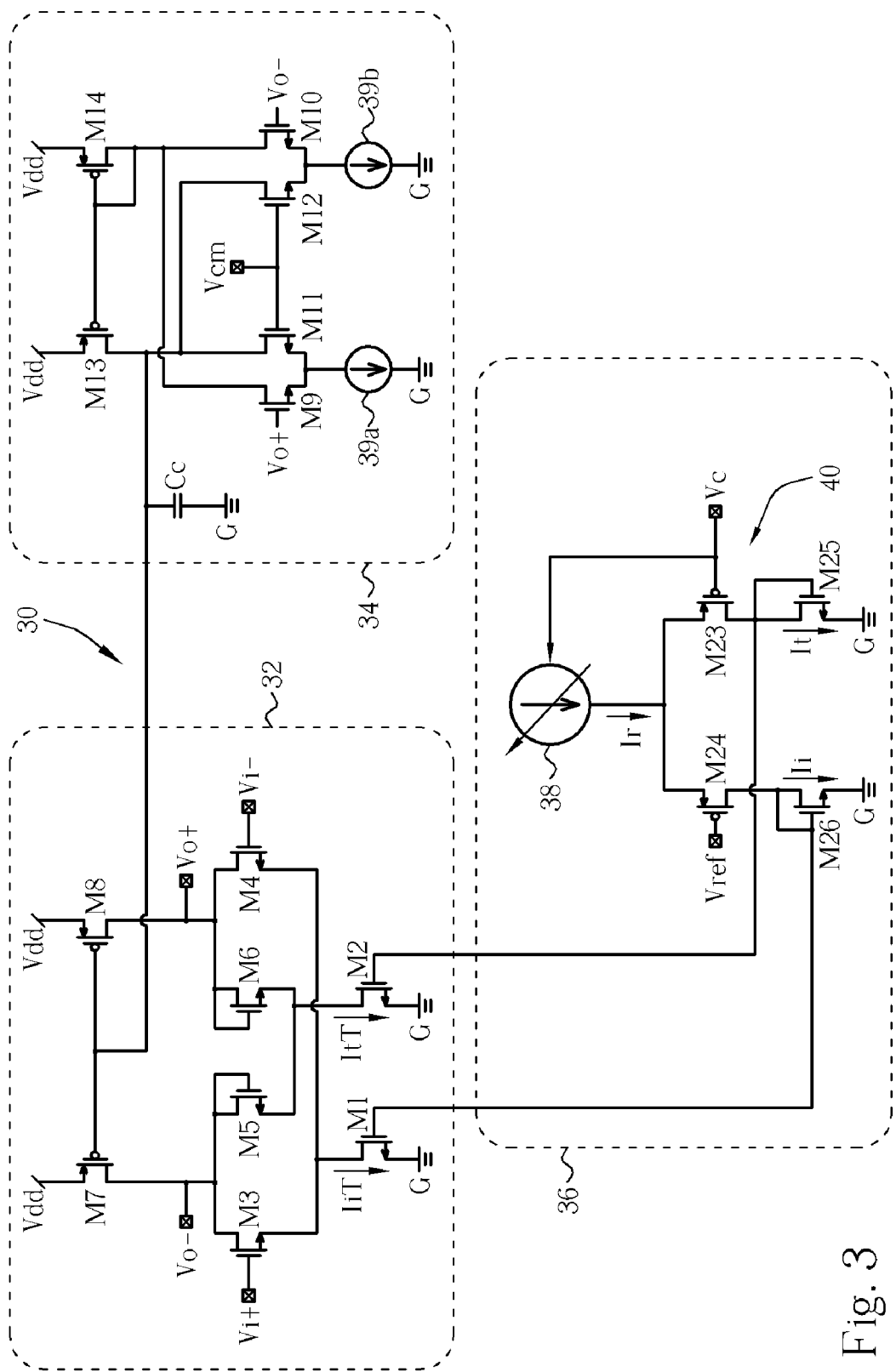
FIG. 3 shows an embodiment of the amplifier from FIG. 2 according to the present invention.

Please refer to FIG. 3. FIG. 3 shows an embodiment of the amplifier 30 from FIG. 2 according to the present invention. As shown in FIG. 3, the amplifier 30 is biased between direct voltages Vdd and G (such as a ground voltage). Preferably, the amplifier 30 is able to receive the differential input signals Vi+ and Vi− and output the differential output signals Vo+ and Vo− after gaining them, in which the gain between the differential input signals and the differential output signals can be adjusted by the value (such as voltage) of the control signal Vc. According to the embodiment shown in FIG. 3, the variable current circuit 38 is able to provide a corresponding reference current Ir according to the value of the control signal Vc, and the p-type MOS transistors M23 and M24 and the n-type MOS transistors M25 and M26 are able to utilize a differential driving method to achieve the differential current circuit 40. Preferably, the gate of each of the common source transistors M23 and M24 is controlled by the control signal Vc and a constant direct voltage Vref to divide the reference current Ir provided by the variable current circuit 38 to the load current It and the input-control current Ii, in which the constant direct voltage Vref is utilized as a reference signal. For instance, when the voltage of the control signal Vc is equal to the constant direct voltage Vref, the current It will equal to the current Ii and equally divide the reference current Ir. If the voltage of the control signal Vc is lower than the voltage Vref, the conductivity of the transistor M23 will be greater than the conductivity of the transistor M24, hence more of the current Ir will flow to the transistor M23 and therefore less current will flow to the transistor M24. After the division of current to the transistors M23 and M24, the transistor M25 will form a current mirror with the n-type MOS transistor M2 from the gain cell 32 to mirror the load current It to the transistor M2 and form a load end current ItT. Similarly, the transistor M26 will form a current mirror with the n-type MOS transistor M1 from the gain cell 32 to mirror the input-control current Ii to the transistor M1 and form an input-control end current IiT on the transistor M1.

According to the embodiment shown in FIG. 3, the gain cell 32 utilizes two matching n-type MOS transistors M3 and M4 to achieve an input stage function of the input circuit 50, and the input-control end current conducted on the transistor M1 controls the bias current of the transistors M3 and M4 through the connected sources. The two other matching n-type MOS transistors M5 and M6 are utilized to achieve the load circuit 52, as shown in FIG. 2, in which the bias current of the connected sources of the two transistors is controlled by the load end current ItT conducted on the transistor M2. The two matching p-type MOS transistors M7 and M8 of the gain cell 32 are utilized as the auxiliary circuit 42 to assist the bias voltage of the input circuit 50, which include the transistors M3 and M4, and the load circuit 52, which include the transistors M5 and M6. Additionally, the capacitor Cc, the transistors M9 to M14, and two matching current sources 39a and 39b within the common-mode feed back circuit 34 are utilized to achieve common-mode feed back compensation, such that the gate of the transistors M9 and M10 will receive the output signals Vo+ and Vo− and the transistors M7 and M8 will adequately adjust the common-mode level of the output signals Vo+ and Vo−. Preferably, the voltage Vcm is a constant voltage.

The operation of the amplifier 30 shown in FIG. 3 is described below. After the input signals Vi+ and Vi−input from the transistors M3 and M4, the input circuit 50 formed by the two transistors will transduce (primarily utilizes the transduction value gm3 of the transistor M3 or M4) the input signal voltage into current, in which the transduction is determined by the value of the input-control end current IiT. The current transduced by the input circuit 50 will then create output signals Vo+ and Vo− on the resistance-type equivalent load provided by the transistors M5 and M6, in which the value of the equivalent load, which is primarily derived from the reciprocal of the transduction gm5 of the transistors M5 and M6, is controlled by the reciprocal of the load current ItT. Hence, the gain between the input signal and the output signal will be directly proportional to gm3/gm5. Since the transduction of gm3 and gm5 is controlled by the input-control end signal IiT and the load end current ItT respectively, in which the transduction of gm3 is directly proportional to $(IiT)^{0.5}$ and the transduction of gm5 is directly proportional to $(ItT)^{0.5}$, the gain will correspond to the ratio of the input-control end current IiT to the load end current ItT, hence IiT/ItT. In other words, the gain is directly proportional to $(IiT/ItT)^{0.5}$. According to the current mirror relation between the transistors M1, M26 and M2, M25, the ratio of the input-control end current IiT to the load end current ItT is controlled by the ratio of the input-control current Ii to the load current It. In other words, by adjusting the difference between the input-control current Ii and the load current It to change the ratio of the input-control current Ii and the load current It, the gain of the gain cell 32 can be adjusted and thereby achieving a variable-gain.

Therefore, by expanding the level of variation between the input-control current Ii and the load current It, a larger gain range can be obtained. Preferably, the present invention is able to adjust the difference between the currents Ii and It according to the difference between the control signal Vc and the reference signal Vref, and also adjust the sum of the currents Ii and It according to the control signal Vc in the variable current circuit 38. Hence, by adjusting the level of variation between the currents Ii and It, the present invention is able to achieve a much larger gain range.

Figure 4:
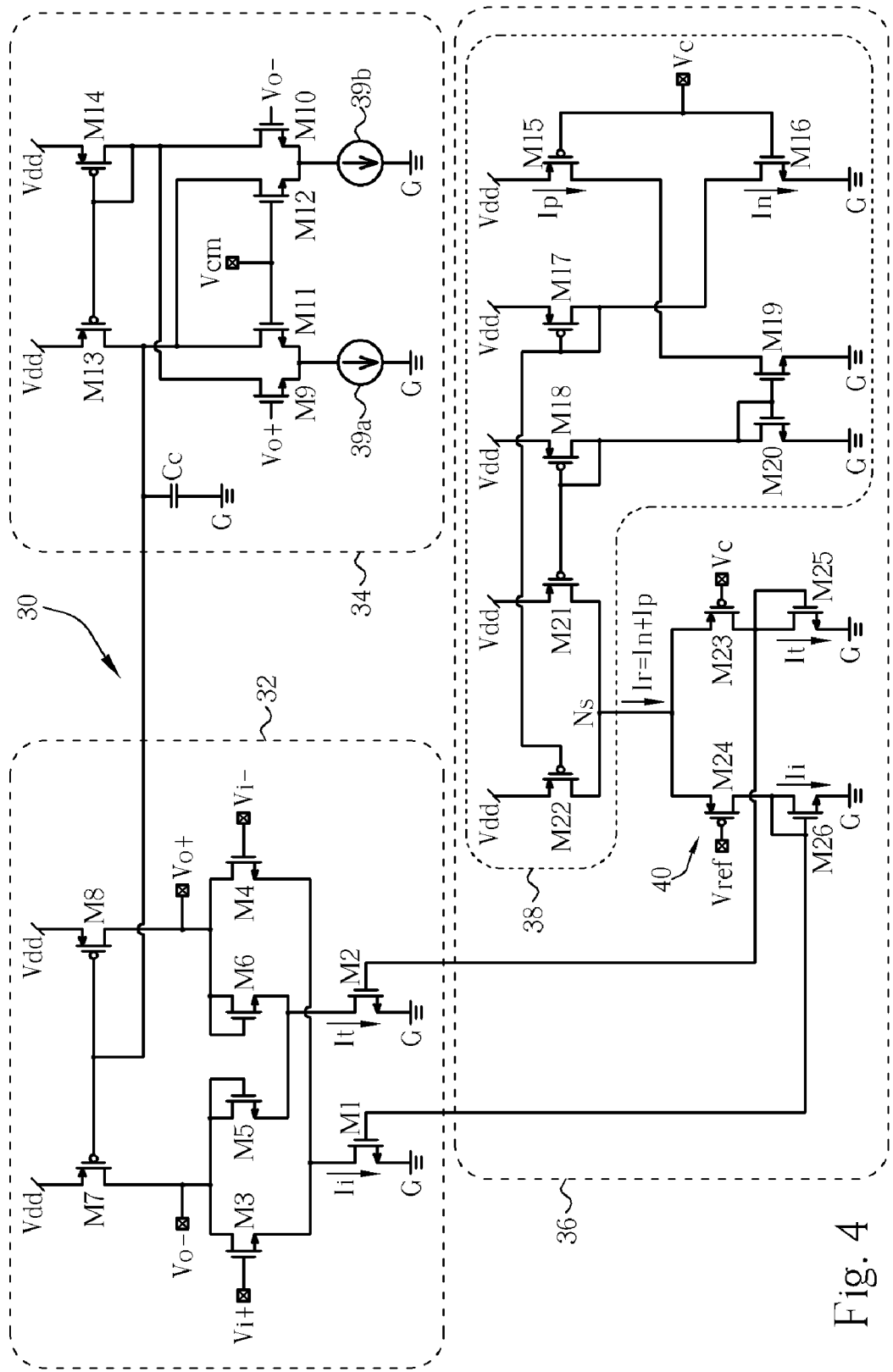
FIG. 4 shows the variable current circuit from FIG. 3 according to an embodiment of the present invention.

Please refer to FIG. 4. FIG. 4 shows the variable current circuit 38 from FIG. 3 according to an embodiment of the present invention. As shown in FIG. 4, the variable current circuit 38 utilizes a complementary driving architecture. According to the present embodiment, the variable current circuit 38 includes a pair of complementary p-type MOS transistor M15 and n-type MOS transistor M16, in which the gates of the two transistors are controlled by the control signal Vc to form a complementary driving architecture. Preferably, the n-type MOS transistors M19 and M20 and the p-type MOS transistors M18 and M21 together form a current mirror to mirror the current Ip conducted by the transistor M15 to the transistor M21, and the p-type MOS transistors M17 and M22 form another current mirror to mirror the current In conducted by the transistor M16 to the transistor M22. Additionally, the currents Ip and In mirrored by the transistors M21 and M22 will combine on the node Ns and form the reference current Ir provided by the variable current circuit 38. The differential current circuit 40 is then able to divide the reference current Ir according to the control signal Vc to the input-control current Ii and the load current It.

Figure 5:
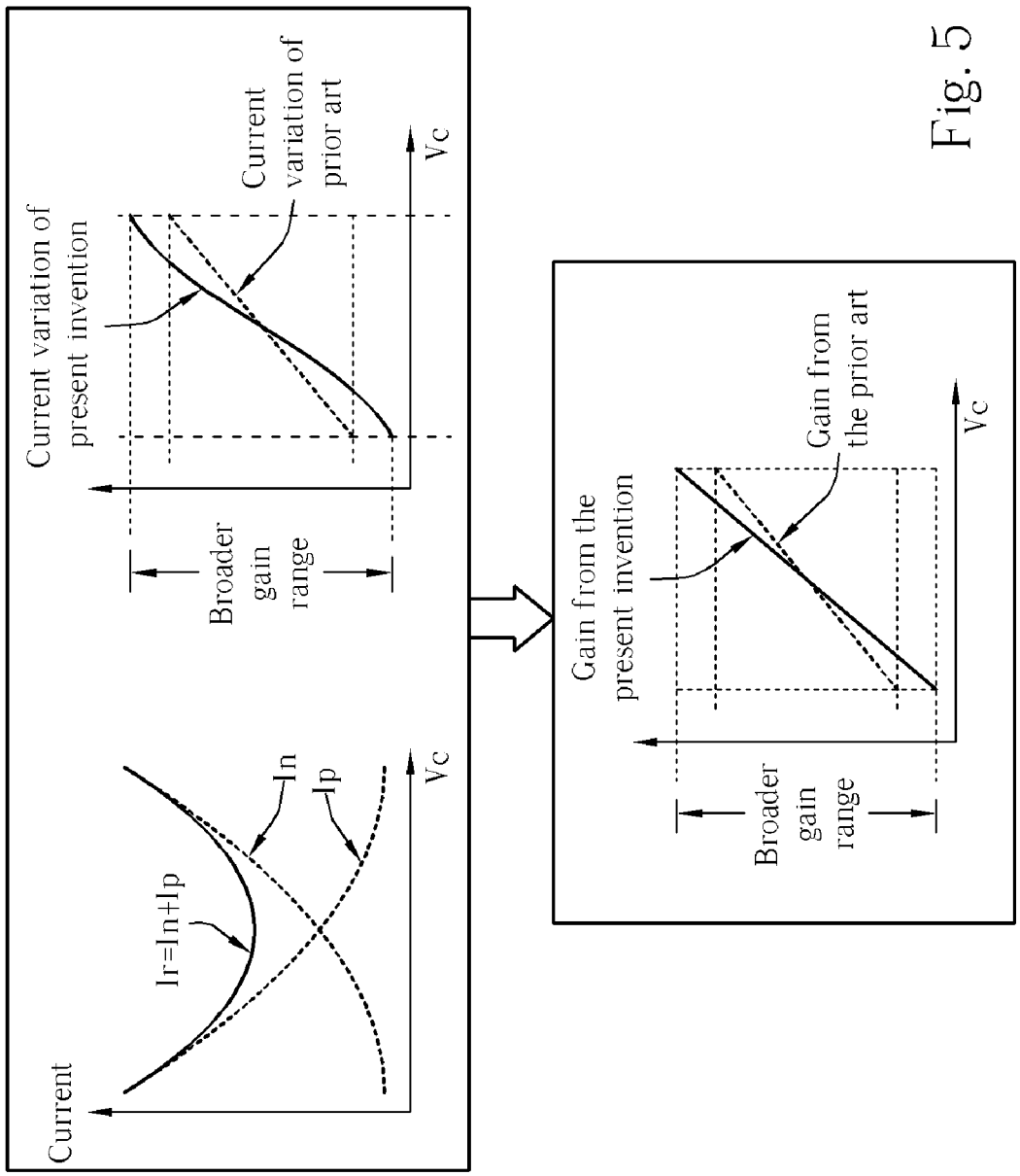
FIG. 5 shows the means of utilizing the control signal Vc to control the amplifier from FIG. 4.

As shown in FIG. 4, the control signal Vc is able to control the difference between the input-control current Ii and the load current It through the differential current circuit 40, and also control the sum (which is also the reference current Ir) of the input-control current Ii and the load current It through the variable current circuit 38, thereby providing a much more dynamic means of adjusting the level of variation between the currents Ii and It. Please refer to FIG. 5. FIG. 5 shows the means of utilizing the control signal Vc to control the amplifier 30 from FIG. 4. First, as indicated by the variable current circuit 38, as the control signal Vc increases within a reasonable range, the current Ip will gradually decrease according to the curve of the quadratic parabola, whereas the current In will gradually increase according to the curve of another quadratic parabola. Hence, as shown in FIG. 5, the reference current Ir, also referred to as the current provided by the variable current circuit 38, will vary according to the parabola within the variable range of the control signal.

Since the reference current Ir will change according to the control signal Vc, the present invention is able to create a much larger current variation on the currents Ii and It than the conventional technique, and produce a broader current variation range within the same control signal variation range, as shown in FIG. 5. As described above, the amplifier 30 of the present invention principally utilizes the variation of currents to achieve a variable-gain, in which the increase of the range of the current variation will ultimately produce a much larger gain range.

Additionally, the variable controlling circuit 36 of the present invention utilizes a differential current circuit 40 to provide a better and thus more linear variable gain control, and provide a stronger resistance against temperature variation and other factors existing during the fabrication process. Since the differential current circuit 40 utilizes two transistors M23 and M24 of the same type, such as p-type, to drive the currents It and Ii respectively, a more linear curve can be utilized to obtain the control of the variable-gain. Moreover, utilizing the two transistors M23 and M24 of the same type to drive the currents It and Ii also increases the resistance of the variable-gain against variations in the fabrication process. For instance, when variations in the fabrication process influence the amplifier 30, the reference current Ir generated by the variable current circuit 38 will deviate from a designated value. However, as the gain itself is determined by the ratio of the current Ii to the current It, hence Ii/It, and the fact that the transistors M23 and M24 are of the same type device, the drifting behavior of the currents Ii and It will cancel out during the conversion to the gain and at the same time eliminate the effect of unsatisfying factors to the variable-gain.

In conclusion, the control signal Vc of the variable gain amplifier of the present invention is able to influence the sum and difference between the input-control current and the load current through the variable current circuit and the differential current circuit, thereby expanding the variation between the input-control current and the load current, achieving a larger gain range, maintaining a strong and linear control characteristic, and providing a better resistance against variations in the fabrication process, such as temperature during the fabrication process. Additionally, the variable current circuit 38 shown in FIG. 4 only represents an embodiment of the present invention, such that other types of controllable current source can be utilized to achieve the variable current circuit 38.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A variable gain amplifier (VGA) comprising:
   a gain controlling circuit comprising:
      a variable current circuit, wherein the variable current circuit provides a corresponding reference current according to a control signal, such that the reference current further corresponds to the control signal; and
      a differential current circuit, wherein the differential current circuit divides the reference current into a load current and an input-control current according to the control signal, such that the sum of the load current and the input-control current equals the reference current, and the difference of the load current and the input-control current is controlled by the control signal; and
   a gain cell comprising:
      a load circuit for providing an active load, wherein the load circuit is biased by a load end current, such that the value of the load end current corresponds to the value of the load current; and
      an input circuit connects to the load circuit, receives an input signal, and establishes an output signal on the load circuit, wherein the input circuit is further biased by an input-control end current, such that the value of the input-control end current corresponds to value of the input-control current.

2. The variable gain amplifier of claim 1, wherein the load circuit changes the magnitude of the active load according to the value of the load end current, and the input circuit provides a transduction according to the value of the load end current, transforms the output signal into a current according to the transduction and transmit the current to the load circuit, and establishes the output signal on the active load of the load circuit.

3. The variable gain amplifier of claim 1, wherein the input circuit establishes a differential output signal on the load circuit, the variable gain amplifier further comprises a common-mode feed back circuit for adjusting the common-mode level of the differential output signal.

4. The variable gain amplifier of claim 1, wherein the variable current circuit comprises:
   a p-type metal oxide semiconductor (MOS) transistor, wherein the gate of the p-type MOS transistor is controlled by the control signal, such that the p-type MOS transistor provides a first current according to the control signal; and
   an n-type metal oxide semiconductor transistor, wherein the gate of the n-type MOS transistor is controlled by the control signal, such that the n-type MOS transistor provides a second current according to the control signal;
   wherein the variable gain amplifier provides the reference current according to the sum of the first current and the second current.

5. The variable gain amplifier of claim 1, wherein the differential current circuit comprises:
   two common source MOS transistors having interconnected sources, wherein each gate of the common source MOS transistors is controlled by the control signal and a constant reference signal respectively;
   wherein the sources of the two MOS transistors collectively receive the reference current for conducting the load current and the input-control current on the drain of each MOS transistor respectively.

6. A method of amplifying variable gain, wherein the method adjusts the gain between an output signal and an input signal according to a control signal, the method comprising:
   providing a reference current according to the control signal, such that the value of the reference current corresponds to the value of the control signal;
   dividing the reference current into a load current and an input-control current according to the control signal, such that the sum of the load current and the input-control current equals the reference current, and the difference between the load current and the input-control current is controlled by the control signal; and gaining the input signal according to the load current and the input-control current for producing the output signal.

7. The method of claim 6, wherein the step of producing the output signal by gaining the input signal according to the load current and the input-control current is achieved by obtaining the ratio between the input-control current and the load current for gaining the input signal.

8. The method of claim 6, wherein the step of providing the reference current according to the control signal comprises:

utilizing the control signal to control the gate of a p-type MOS transistor, such that the p-type MOS transistor provides a first current according to the control signal;

utilizing the control signal to control the gate of an n-type MOS transistor, such that the n-type MOS transistor provides a second current according to the control signal; and providing the reference current according to the sum of the first current and the second current.

9. The method of claim 6, wherein the step of dividing the reference current into the load current and the input-control current comprises:

utilizing the sources of two MOS transistors having interconnected sources to receive the reference current; and utilizing the control signal to control one of the MOS transistors and utilizing a constant reference signal to control the other MOS transistor for respectively conducting the load current and the input-control current on the drain of each MOS transistor.

\* \* \* \* \*